United States Patent
Sakamoto et al.

(10) Patent No.: US 8,102,670 B2
(45) Date of Patent: Jan. 24, 2012

(54) CIRCUIT DEVICE AND METHOD OF MANUFACTURING THE SAME

(75) Inventors: Hideyuki Sakamoto, Gunma (JP); Hidefumi Saito, Gunma (JP); Yasuhiro Koike, Gunma (JP); Masao Tsukizawa, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 480 days.

(21) Appl. No.: 12/239,407

(22) Filed: Sep. 26, 2008

(65) Prior Publication Data

US 2009/0086455 A1   Apr. 2, 2009

(30) Foreign Application Priority Data

Sep. 27, 2007   (JP) ................. 2007-250485
Oct. 31, 2007   (JP) ................. 2007-284348

(51) Int. Cl.
*H05K 7/14*   (2006.01)
*H05K 7/18*   (2006.01)

(52) U.S. Cl. ................ 361/796; 361/792; 361/794

(58) Field of Classification Search ............ 361/730, 361/752, 796, 800, 792, 794, 799
See application file for complete search history.

(56) References Cited

U.S. PATENT DOCUMENTS

| | | |
|---|---|---|
| 4,901,203 A | 2/1990 | Kobayashi et al. |
| 5,105,322 A | 4/1992 | Steltzer |
| 5,408,383 A | 4/1995 | Nagasaka et al. |
| 5,444,297 A | 8/1995 | Oshima et al. |
| 5,519,252 A | 5/1996 | Soyano et al. |
| 5,586,388 A | 12/1996 | Hirao et al. |
| 5,610,799 A | 3/1997 | Kato |
| 5,646,827 A | 7/1997 | Hirao et al. |
| 5,657,203 A | 8/1997 | Hirao et al. |
| 5,694,294 A | 12/1997 | Ohashi et al. |
| 5,751,058 A | 5/1998 | Matsuki |

(Continued)

FOREIGN PATENT DOCUMENTS

JP   10-229288   8/1998

(Continued)

OTHER PUBLICATIONS

Sakamoto et al., U.S. Office Action mailed Nov. 13, 2009, directed to U.S. Appl. No. 12/239,286; 13 pages.

(Continued)

*Primary Examiner* — Hung S Bui
(74) *Attorney, Agent, or Firm* — Morrison & Foerster LLP

(57) ABSTRACT

Provided is a circuit device, in which circuit elements incorporated are electrically connected to each other via a lead so as to achieve both of the enhanced functionality and miniaturization. In a hybrid integrated circuit device, a first circuit board and a second circuit board are incorporated into a case member in a way that a first circuit board is overlaid with a second circuit board. A first circuit element is arranged on the upper face of the first circuit board and a second circuit element is arranged on the upper face of the second circuit board. Leads provided in the hybrid integrated circuit device include a lead connected only to the first circuit element mounted on the first circuit board, a lead connected only to the second circuit element mounted on the second circuit board, and a lead connected to both of the first circuit element and the second circuit element.

8 Claims, 11 Drawing Sheets

U.S. PATENT DOCUMENTS

| | | | |
|---|---|---|---|
| 5,777,846 | A | 7/1998 | Hayes et al. |
| 5,967,849 | A * | 10/1999 | Shiga et al. .................... 439/654 |
| 5,995,380 | A * | 11/1999 | Maue et al. .................... 361/826 |
| 6,027,535 | A | 2/2000 | Eberle et al. |
| 6,072,122 | A | 6/2000 | Hosoya |
| 6,081,425 | A | 6/2000 | Cheng |
| 6,144,571 | A | 11/2000 | Sasaki et al. |
| 6,147,869 | A | 11/2000 | Furnival |
| 6,166,908 | A | 12/2000 | Samaras et al. |
| 6,219,236 | B1 | 4/2001 | Hirano et al. |
| 6,226,182 | B1 | 5/2001 | Maehara |
| 6,304,448 | B1 | 10/2001 | Fukada et al. |
| 6,348,653 | B1 | 2/2002 | Cho |
| 6,350,949 | B1 | 2/2002 | Boyd |
| 6,421,244 | B1 | 7/2002 | Shinohara et al. |
| 6,509,629 | B2 | 1/2003 | Yoshimatsu et al. |
| 6,521,983 | B1 | 2/2003 | Yoshimatsu et al. |
| 6,583,355 | B2 | 6/2003 | Skrzypchak |
| 6,690,582 | B2 | 2/2004 | Sumida |
| 6,717,812 | B1 | 4/2004 | Pinjala et al. |
| 6,801,430 | B1 | 10/2004 | Pokharna |
| 6,958,535 | B2 | 10/2005 | Hirano et al. |
| 6,995,461 | B2 | 2/2006 | Soyano et al. |
| 7,209,367 | B2 | 4/2007 | Nakano et al. |
| 7,218,517 | B2 | 5/2007 | Wolford et al. |
| 7,248,471 | B2 | 7/2007 | Wabiszczewicz |
| 7,375,287 | B2 | 5/2008 | Rathmann |
| 7,589,978 | B1 | 9/2009 | Holdredge et al. |
| 7,623,347 | B2 | 11/2009 | Matsui |
| 7,706,146 | B2 | 4/2010 | Lee et al. |
| 7,751,194 | B2 | 7/2010 | Sakamoto et al. |
| 7,782,628 | B2 | 8/2010 | Sakamoto et al. |
| 7,839,655 | B2 * | 11/2010 | Clark ............................ 361/800 |
| 2008/0204998 | A1 | 8/2008 | Matsui |
| 2009/0086431 | A1 | 4/2009 | Sakamoto et al. |
| 2009/0086442 | A1 | 4/2009 | Sakamoto et al. |
| 2009/0086454 | A1 | 4/2009 | Sakamoto et al. |
| 2009/0103276 | A1 | 4/2009 | Sakamoto et al. |
| 2010/0284159 | A1 | 11/2010 | Sakamoto et al. |

FOREIGN PATENT DOCUMENTS

| | | |
|---|---|---|
| JP | 2000-228491 | 8/2000 |
| JP | 2007-036014 | 2/2007 |

OTHER PUBLICATIONS

Sakamoto et al., U.S. Office Action mailed Dec. 16, 2009, directed to U.S. Appl. No. 12/239,250; 8 pages.

Sakamoto et al., U.S. Office Action mailed Mar. 30, 2010, directed to U.S. Appl. No. 12/239,256; 6 pages.

Sakamoto et al., U.S. Office Action mailed Sep. 22, 2010 directed to U.S. Appl. No. 12/239,256; 11 pages.

Sakamoto, H. et al., U.S. Office Action mailed Nov. 15, 2010, directed to a related U.S. Appl. No. 12/837,078; 7 pages.

Sakamoto, H. et al. U.S. Office Action mailed Jun. 23, 2011, directed to U.S. Appl. No. 12/239,256; 13 pages.

Sakamoto, H. et al., U.S. Office Action mailed Apr. 25, 2011, directed to U.S. Appl. No. 12/837,078; 10 pages.

Sakamoto, H. et al., U.S. Office Action mailed Feb. 4, 2011, directed to U.S. Appl. No. 12/239,256; 12 pages.

Sakamoto, H. et al., U.S. Office Action mailed Jul. 29, 2011, directed to U.S. Appl. No. 12/837,078; 11 pages.

Sakamoto et al., U.S. Office Action mailed Oct. 5, 2011, directed to U.S. Appl. No. 12/239,215; 9 pages.

* cited by examiner

CIRCUIT DEVICE AND METHOD OF MANUFACTURING THE SAME

This application claims priority from Japanese Patent Application Number JP 2007-250485, filed on Sep. 27, 2007, and JP 2007-284348 filed on Oct. 31, 2007, the content of which is incorporated herein by reference in its entirety.

BACKGROUND OF THE INVENTION

1. Field of the Invention

The present invention relates to a circuit device and a method of manufacturing the same, and in particular, relates to a circuit device, in which a hybrid integrated circuit formed on an upper face of a circuit board is sealed with a case member, and a method of manufacturing the same.

2. Description of the Related Art

The configuration of a hybrid integrated circuit device 150 employing a case member 111 is described with reference to FIG. 11. The hybrid integrated circuit device 150 includes: a substrate 101 made of a metal, such as aluminum; an insulating layer 102 formed so as to cover the upper face of the substrate 101; a conductive pattern 103 formed on the upper face of the insulating layer 102; and a circuit element 110 such as a transistor electrically connected to the conductive pattern 103. The circuit element 110 is sealed with the case member 111 and a sealing resin 108.

Specifically, the case member 111 has an approximately frame-like shape and is in contact with the side face of the substrate 101. In addition, in order to secure a sealing space over the upper face of the substrate 101, the upper end part of the case member 111 is positioned above the upper face of the substrate 101. Then, the sealing resin 108 is filled in the space surrounded by the case member 111 above the substrate 101 so as to cover the circuit element 110 such as a semiconductor element. With this configuration, the circuit element incorporated on the upper face of the substrate 101 can be sealed with the sealing resin 108 being filling in the space surrounded by the case member 111 or the like, even if the substrate 101 is relatively large.

This technology is described for instance in Japanese Patent Application Publication No. 2007-036014.

In the hybrid integrated circuit device 150 described above, a power transistor, such as an insulated gate bipolar transistor (IGBT), and a driver IC for driving this power transistor are mounted on the upper face of the substrate 101. In addition, a controlling element, such as a microcomputer for controlling this driver IC, is mounted on the mounting substrate side on which the hybrid integrated circuit device 150 is mounted. Because of this configuration, the area required to mount a circuit which controls for driving a load, such as a motor, has to be large on the mounting substrate side.

For improving the packaging density of the hybrid integrated circuit device 150, a plurality of substrates 101 may be overlaid inside the case member 111 so that the circuit element is incorporated in each of the substrates 101. However, it is difficult to provide a plurality of substrates 101 inside the case member 111 in this manner and to separately seal with resin the circuit elements arranged on the upper face of each of the substrates.

SUMMARY OF THE INVENTION

It is thus an object of the present invention to provide a circuit device, in which circuit elements incorporated therein are electrically connected to each other via a lead to achieve both of the enhanced functionality and miniaturization, and a method of manufacturing the same.

According to an aspect of the present invention, a circuit device comprises: a case member; a first circuit board incorporated into the case member, the first circuit board having a first conductive pattern formed in a surface thereof; a second circuit board overlapped with the first circuit board and incorporated into the case member, the second circuit board having a second conductive pattern formed in a surface thereof; a first circuit element mounted on the first circuit board and electrically connected to the first conductive pattern; a second circuit element mounted on the second circuit board and electrically connected to the second conductive pattern; and a lead fixedly secured to either the first circuit board or the second circuit board, wherein the lead includes a first lead connected only to the first circuit element mounted on the first circuit board, a second lead connected only to the second circuit element mounted on the second circuit board, and a third lead connected to both of the first circuit element mounted on the first circuit board and the second circuit element mounted on the second circuit board.

According to another aspect of the present invention, a circuit device comprises: a case member; a first circuit board incorporated into the case member, the first circuit board having a first conductive pattern formed on a surface thereof; a second circuit board arranged over the first circuit board and incorporated into the case member, the second circuit board having a second conductive pattern formed on a surface thereof; a first circuit element mounted on the first circuit board and electrically connected to the first conductive pattern; a second circuit element mounted on the second circuit board and electrically connected to the second conductive pattern; a sealing resin which is formed on a surface of the second circuit board so as to seal the second circuit element; and a lead having one end thereof being connected to the first conductive pattern on the surface of the first circuit board and having the other end thereof passing through a through-hole provided in the second circuit board to be guided to the outside, wherein the lead includes a first lead electrically connected to the second circuit element mounted on an upper face of the second circuit board, and a second lead not electrically connected to the second circuit element mounted on the second circuit board, and a bonding agent is filled in a gap between the first lead and the through-hole of the second circuit board, and a bonding agent is also filled in a gap between the second lead and the through-hole.

According to yet another aspect of the present invention, a method of manufacturing a circuit device comprises the steps of: incorporating, into a case member, a first circuit board having a first conductive pattern and a first circuit element mounted on a surface thereof, the first circuit board having a lead fixedly secured to a pad formed of the first conductive pattern; incorporating, into the case member, a second circuit board having a second conductive pattern and a second circuit element mounted on a surface thereof, and a through-hole formed therein, while causing the lead to pass through the through-hole in the second circuit board; and forming a sealing resin on a surface of the second circuit board so as to cover the second conductive pattern and the second circuit element, wherein the lead includes a first lead electrically connected to the second circuit element mounted on an upper face of the second circuit board, and a second lead not electrically connected to the second circuit element mounted on the second circuit board, and in the step of fixedly securing the lead, a bonding agent is applied to both of a through-hole which the first lead penetrates, and a through-hole which the second lead penetrates, to cover both of the through-holes.

BRIEF DESCRIPTION OF THE DRAWINGS

FIG. 1A is a cross sectional view, and FIG. 1B and FIG. 1C are perspective views.

FIG. 2A is a perspective view and FIG. 2B is a cross sectional view.

FIG. 6A is a cross sectional view and FIG. 6B is a plan view when viewed from below.

FIG. 8A is a cross sectional view and FIG. 8B is a cross sectional view.

FIG. 9A is a cross sectional view and FIG. 9B is a perspective view.

DESCRIPTION OF THE INVENTION

Figure 1A:
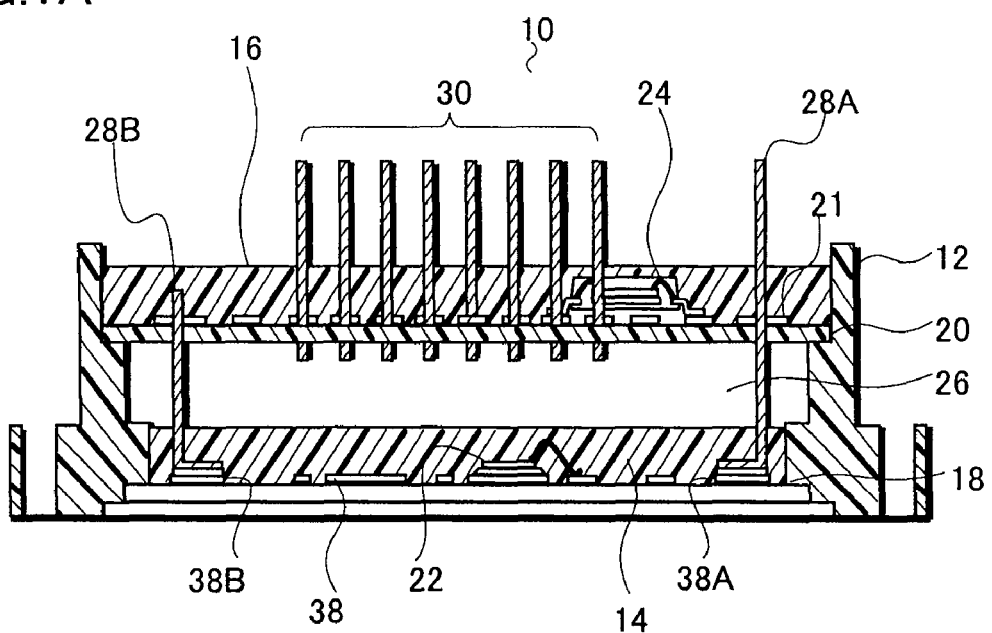
FIGS. 1A to 1C are views showing a hybrid integrated circuit device which is an embodiment of the circuit device of the present invention.
Figure 1B:
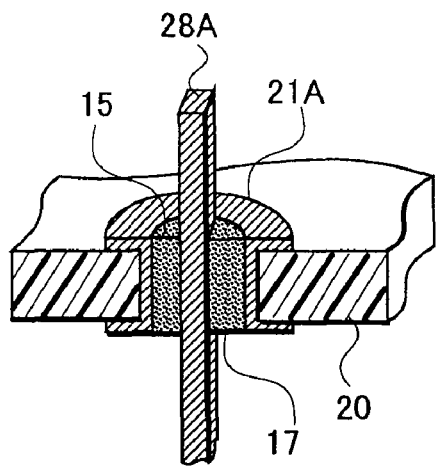
Figure 1C:
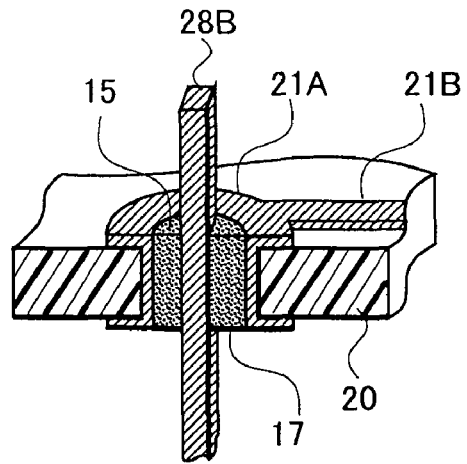

As an example of the circuit device, the configuration of a hybrid integrated circuit device 10 is described with reference to FIGS. 1A to 1C. FIG. 1A is a cross sectional view of the hybrid integrated circuit device 10, FIG. 1B is a perspective view showing a part of a second circuit board 20 which a lead 28A penetrates, and FIG. 1C is a perspective view showing a part of the second circuit board 20 which a lead 28B penetrates.

As shown in FIG. 1A, in the hybrid integrated circuit device 10, a first circuit board 18 and a second circuit board 20 are incorporated into a case member 12 in a way that a first circuit board 18 is overlaid with a second circuit board 20. A first circuit element 22 (a power transistor, for example) is arranged on the upper face of the first circuit board 18, and a second circuit element 24 (a microcomputer, for example) is arranged on the upper face of the second circuit board 20. In addition, the leads 28A, 28B are fixedly secured to the first circuit board 18, and a lead 30 is fixedly secured to the second circuit board 20.

The case member 12 is formed by injection molding a thermoplastic resin, such as polyphenylene sulfide (PPS), polybutylene terephthalate (PBT), or polyethylene terephthalate (PET), and exhibits an approximately frame-like shape. As shown in FIG. 1A, each of the upper face and the lower face of the case member 12 forms an opening, respectively, and the opening in the upper face is covered with the second circuit board 20, and the opening in the lower face is covered with the first circuit board 18. Additionally, a screw hole is provided at each of the left and right end portions of the case member 12.

In addition, the opening may be provided by opening a side wall part of the case member 12, so that a hollow portion 26 of the case member 12 can communicate with the outside through this opening. In this way, the air inside the hollow portion 26 heated by the heat generated in the first circuit element 22 can be released to the outside through this opening. Accordingly, the heat generated in the first circuit element 22 is released to the outside efficiently, thereby preventing the first circuit element 22 from being overheated.

The first circuit board 18 is incorporated into the lower opening of the case member 12, and is made of either aluminum (Al), copper (Cu), or an alloy containing at least one of these metals as a primary material. Here, two metal substrates made of aluminum are employed as the first circuit board 18. However, the first circuit board 18 may be made of one metal substrate. The detail of the first circuit board 18 will be described with reference to FIG. 3.

The second circuit board 20 is incorporated into the opening on the upper side of the case member 12, and here a printed circuit board (PCB) is employed. Specifically, a paper phenol substrate, a glass epoxy substrate, or the like is employed as the second circuit board 20. Alternatively, a substrate made of ceramic may be employed as the second circuit board 20. In addition, a second conductive pattern 21 may be formed only on the upper face of the second circuit board 20, or the second conductive pattern 21 may be provided on the both sides thereof. In addition, the second conductive pattern 21 stacked in three or more layers may be formed on the second circuit board 20. A through-hole is provided in the second circuit board 20 to cause a lead 28A and a lead 28B to penetrate the through-hole.

The first circuit element 22 is an element electrically connected to a first conductive pattern 38 formed on the upper face of the first circuit board 18. As the first circuit element 22, a power transistor for switching a current equal to or more than one ampere is employed, for example. Here, a bipolar transistor, a field effect transistor (FET), or an insulated gate bipolar transistor (IGBT) is employed as the power transistor. In addition, as the first circuit element 22, an element other than the transistor also can be generally employed, and for example, an active element, such as an LSI or a diode, or a passive element, such as a chip capacitor or a chip resistor, is employed.

Additionally, if the first circuit element 22 is a semiconductor element, such as a power transistor, the rear face thereof is fixedly secured via a conductive adhesive, such as solder. In addition, a heat sink made of a metal, such as copper, may be provided between the first circuit element 22 and the first conductive pattern 38. Then, an electrode formed on the upper face of the first circuit element 22 is connected to the first conductive pattern 38 via a metal thin wire 42.

In addition, a diode constituting a rectifier circuit, a coil or a capacitor constituting a smoothing circuit, a driver IC which applies a control signal to the control electrode of the above-described power transistor, a thermistor, and the like are employed as the first circuit element 22.

As the second circuit element 24 mounted on the second circuit board 20, a microcomputer (controlling element), having a smaller amount of heat generation than the first circuit element 22 mounted on the first circuit board 18, or the like is mounted. Accordingly, as the second circuit board 20, a printed circuit board which is less thermally conductive but inexpensive can be employed. Additionally, since the printed circuit board requires low cost for a design modification and manufacture, the modification can be easily made with a modification of the shape of the conductive pattern of the second circuit board 20 even if the specification of the microcomputer or the like employed as the second circuit element 24 has been modified. In addition, the second circuit board 20 made of an insulating material, such as an epoxy resin, has a lower thermal conductivity than the first circuit board 18 made of a metal. Accordingly, the heat conduction is suppressed by the second circuit board 20, whereby the heat generated in the first circuit element 22, which is a power transistor, is suppressed from being conducted to the second circuit element 24, which is a microcomputer.

The second circuit element 24 is an element electrically connected to the second conductive pattern 21 formed in the surface of the second circuit board 20, and a circuit element having a lower operating temperature than the first circuit element 22 is generally employed. As a specific example, for example, a microcomputer, an aluminum electrolytic capacitor, and the like are mounted on the second circuit board 20 as the second circuit element 24. In addition, as the second circuit element 24, an active element and a passive element are generally employed as is the case with the first circuit element 22. Alternatively, a crystal oscillator or a semiconductor memory may be employed as the second circuit element 24. In addition, the second circuit element 24 may be fixedly secured only to the upper face of the second circuit board 20, or may be fixedly secured only to the lower face thereof, or may be fixedly secured to both sides thereof.

Additionally, as shown in FIG. 1A, an LSI as the microcomputer is mounted on the upper face of the second circuit board 20, in the form of a resin sealed package. However, the microcomputer may be fixedly secured to the second conductive pattern 21 formed in the surface of the second circuit board 20, in the form of a bare chip.

The first sealing resin 14 is formed so as to cover the entire upper face of the first circuit element 22 and the first circuit board 18. The first sealing resin 14 is made of a resin material, such as an epoxy resin in which a filler, such as alumina ($Al_2O_3$) or silica ($SiO_2$), is mixed. In this way, the moisture resistance of the first circuit element 22 is improved by the first circuit element 22 being sealed with the first sealing resin 14. In addition, since a connected portion (made of a bonding material, such as solder) between the first circuit element 22 and the first conductive pattern 38 is covered with the first sealing resin 14, the vibration resistance of this connected portion is improved. In addition, the first sealing resin 14 made of a resin, in which a filler is mixed, has a light shielding property that does not allow light to pass therethrough. Accordingly, since the first sealing resin 14 having a light shielding property covers the first conductive pattern 38 and the first circuit element 22, which are formed on the upper face of the first circuit board 18, the shape of the first conductive pattern 38 and the position of the first circuit element 22 may be concealed. Here, as shown in FIG. 1A, the first sealing resin 14 is formed so as to cover the first circuit element 22 and the metal thin wire 42 used for the connection thereof. However, the first circuit element 22 does not need to be completely covered with the first sealing resin 14. Alternatively, the upper end part of the first circuit element 22 may project upward from the upper face of the first sealing resin 14 while the connected portion between the first circuit element 22 and the first conductive pattern 38 being covered with the first sealing resin 14.

The first sealing resin 14 is formed inside of the side wall of the case member 12, specifically, in a space surrounded by the first circuit board 18, and the second circuit board 20, but the first sealing resin 14 is not formed so as to completely fill into this space. Accordingly, the hollow portion 26, in which the first sealing resin 14 is not filled, is provided in the internal space of the case member 12. Alternatively, since the first circuit element 22 is sealed with the internal space of the case member 12, the hybrid integrated circuit device 10 may be configured without the first sealing resin 14.

In addition, the hollow portion 26 may be sealed with the case member 12, the first circuit board 18, and the second circuit board 20, or may communicate with the outside. If the hollow portion 26 communicates with the outside, then a communicating hole for allowing the hollow portion 26 to communicate with the outside may be provided, for example, in a side wall part of the case member 12 or in a portion between the case member 12 and the second circuit board 20.

The second sealing resin 16 (sealing resin) is formed so as to cover the entire upper face of the second circuit element 24 and the second circuit board 20, and the second sealing resin 16 is made of a resin material or an urethane resin in which a filler is mixed, as is the case with the first sealing resin 14. By covering the second circuit element 24 and the second circuit board 20 with the second sealing resin 16, the moisture resistance and the vibration resistance of the second circuit element 24 are improved and also the shape of the second conductive pattern 21 provided in the upper face of the second circuit board 20 and the arrangement of the second circuit element 24 are concealed. Here, the second sealing resin 16 does not necessarily need to be formed so as to completely cover the second circuit element 24. Alternatively, the second sealing resin 16 may be formed so that the upper part of the second circuit element 24 may project upward from the upper face of the second sealing resin 16 while the connection portion between the second circuit element 24 and the second conductive pattern 21 may be covered.

Here, the first sealing resin 14 and the second sealing resin 16 described above are not necessarily required. In addition, the internal space covered by the case member 12, the first circuit board 18, and the second circuit board 20 may be filled with the sealing resin.

Each of the lower ends of the leads 28A, 28B is fixedly secured to the upper face of the first circuit board 18. As shown in FIG. 1A, the lower end of the lead 28A is fixedly secured to a pad 38A formed in the upper face of the first circuit board 18. The lower end of the lead 28B is fixedly secured to an upper face of a pad 38B formed in the upper face of the first circuit board 18. The lead 28A and the lead 28B have different roles from each other although the lower ends of both of the leads are fixedly secured to the upper face of the first circuit board 18.

The lead 28A (first lead) is a lead to be connected to the first circuit element 22 (a power transistor, for example) arranged on the upper face of the first circuit board 18. That is, an electric signal supplied to the power transistor or an electric signal switched by the power transistor passes through the lead 28A. Since the lead 28A needs to connect the first circuit element 22 to a load positioned outside or the like, the upper end thereof penetrates the second sealing resin 16 to be guided to the outside.

On the other hand, the lead 28B (third lead) is connected to both of the first circuit element 22 arranged on the upper face of the first circuit board 18 and the second circuit element 24 arranged on the upper face of the second circuit board 20. That is, a control signal, which is generated in the second circuit element 24 (microcomputer, for example) and supplied to the first circuit element 22 (power transistor, for example), passes through the second lead 28B. If the purpose for providing the lead 28B is only to connect the first circuit element 22 to the second circuit element 24, the upper end thereof does not need to be guided to the outside. Here, the upper end of the lead 28B is terminated inside the second sealing resin 16. However, if the lead 28B is connected to the first circuit element 22 and the second circuit element 24 and is also connected to an external load or the like, the upper end of the lead 28B may project upward from the second sealing resin 16.

The lower end of the lead 30 (second lead) is connected to the second conductive pattern 21 provided in the upper face of the second circuit board 20 and the upper end thereof penetrates the second sealing resin 16 and projects upward. That is, the lead 30 is a lead for connecting the second circuit element 24 arranged on the upper face of the second circuit board 20 to the outside. The lower end of the lead 30 is inserted into a pore which is provided penetration the second circuit board 20 and the portion near the lower end of the lead 30 is secured to the pore. Here, the second conductive pattern 21 formed on the upper face of the second circuit board 20 and the lead 30 are connected to each other via a conductive adhesive, such as solder.

FIG. 1B is a perspective view of a part of the second circuit board 20 which the lead 28A penetrates. As described above, the lead 28A is a lead which is connected only to the first circuit element 22 arranged on the upper face of the first circuit board 18 but is not connected to the second circuit element 24 arranged on the second circuit board 20. Accordingly, the lead 28A only needs to penetrate the through-hole 15 of the second circuit board 20, and therefore needs not to be connected to the second conductive pattern 21 formed on the upper face of the second circuit board 20. However, in this embodiment, in order to prevent the second sealing resin 16, which is applied in a liquid state in the manufacturing process, from leaking through the through-hole 15, a bonding agent 17 made of solder or the like is filled in a portion between the lead 28A and the through-hole 15. Additionally, in order to facilitate the application of the bonding agent 17, which is solder, a pad 21A is formed in the periphery of the through-hole 15 and the inner wall of the through-hole 15 is covered with a metal film of copper or the like. Additionally, the circular pad 21A is formed independently from other surrounding second conductive pattern 21.

FIG. 1C is a perspective view of a portion of the second circuit board 20 which the lead 28B penetrates. The details of the portion of the second circuit board 20 which the lead 28B penetrates are basically the same as those of the case of the lead 28A, and the difference therebetween lies in that the pad 21A is connected to the second circuit element 24 through a wiring 21B. Here, the bonding agent 17 has a function to connect the lead 28B and the pad 21A (second conductive pattern 21) as well as to electrically connect the both with each other.

In this embodiment, as shown in FIG. 1B, the bonding agent 17 is filled in the gap between the lead 28A and the through-hole 15. This configuration prevents the resin from leaking in the middle of the manufacturing process. Usually, a circuit element placed on the upper face of the second circuit board 20 and the lead 28A do not need to be conducted to each other, so the bonding agent 17 does not need to be filled in a portion between the through-hole 15 and the lead 28A. A through-hole formed only for the purpose for causing a lead to penetrate the through-hole in this way is referred to as a "passing-through hole". However, if the gap between the lead 28A and the side wall of the through-hole 15 is left intact without being covered, the resin leaks from this gap in the step of covering the upper face of the second circuit board 20 with the second sealing resin 16. That is, in this step, although the semi-solid or liquid second sealing resin 16 is applied extensively onto the upper face of the second circuit board 20 and then is heat-cured, the semi-solid or liquid second sealing resin 16 leaks out of the gap between the lead 28A and the through-hole 15 to the hollow portion 26.

In order to avoid this problem, the bonding agent 17 is filled in the gap between the lead 28A and the side wall of the through-hole 15, in this embodiment. In this way, the bonding agent 17 is filled in the gap between all the leads 28A, 28B and the through-holes 15 to prevent the above-described leakage of the resin. Accordingly, the penetration of the resin material into the hollow portion 26 is prevented.

In addition, in the above-described hybrid integrated circuit device 10, the thermal interference between the first circuit element 22 mounted on the first circuit board 18 and the second circuit element 24 mounted on the second circuit board 20 is suppressed by providing the hollow portion 26. This will be described below.

Specifically, in this embodiment, by providing two overlaid circuit boards (the first circuit board 18 and second circuit board 20) and then incorporating a circuit element into the respective circuit boards, a power block formed of a power transistor and a control block for controlling this power block are incorporate in one package of the hybrid integrated circuit device 10. In addition, in order to improve the moisture resistance and the vibration resistance, the circuit elements mounted on each of the circuit boards need to be sealed with a sealing resin. As shown in FIG. 1A, the first sealing resin 14 is formed inside the case member 12 so as to cover the first circuit element 22 arranged in the first circuit board 18, and in addition, the second sealing resin 16 is formed so as to cover the second circuit element 24 fixedly secured to the upper face of the second circuit board 20.

However, for example, considering a case where a power transistor is employed as the first circuit element 22 and a microcomputer is employed as the second circuit element, the microcomputer may cause a misoperation due to a heat generated in the power transistor. Specifically, during operation of the hybrid integrated circuit device 10, the temperature Tc outside the device is guaranteed so as not to be more than 100° C., and the temperature (Tj) of the first circuit element 22 incorporated into the device is guaranteed so as to not be higher than 150° C. On the other hand, the maximum operating temperature of the microcomputer, which is the second circuit element 24, is lower than that of the power transistor, such as an IGBT, and is not higher than 85° C., for example. Accordingly, if the first sealing resin 14 is formed so as to completely fill the internal space of the case member 12, a heat generated in the first circuit element 22 conducts to the second circuit element 24, which is the microcomputer, via the first sealing resin 14. As a result, the second circuit element 24, which is the microcomputer, is heated to 85° C. or higher and the operation thereof may become unstable.

In this embodiment, the interior of the case member 12 is not completely filled with the first sealing resin 14 for sealing the first circuit element 22, but the hollow portion 26, which is an unfilled region in which the first sealing resin 14 is not filled, is provided inside the case member 12. Therefore, air is left in this hollow portion 26. Accordingly, even if a heat generated in the first circuit element 22, which is a power transistor, is conducted to the first sealing resin 14, the conduction of the heat is prevented by the hollow portion 26 formed of an air having a high thermal resistance. Accordingly, the conduction of this heat to the second circuit element 24 (microcomputer) is suppressed. In this way, the temperature of the second circuit element 24, which is a microcomputer, is suppressed from being overheated to the upper limit (85° C., for example) of the operating temperature or higher, so that the microcomputer can operate stably.

Figure 2A:
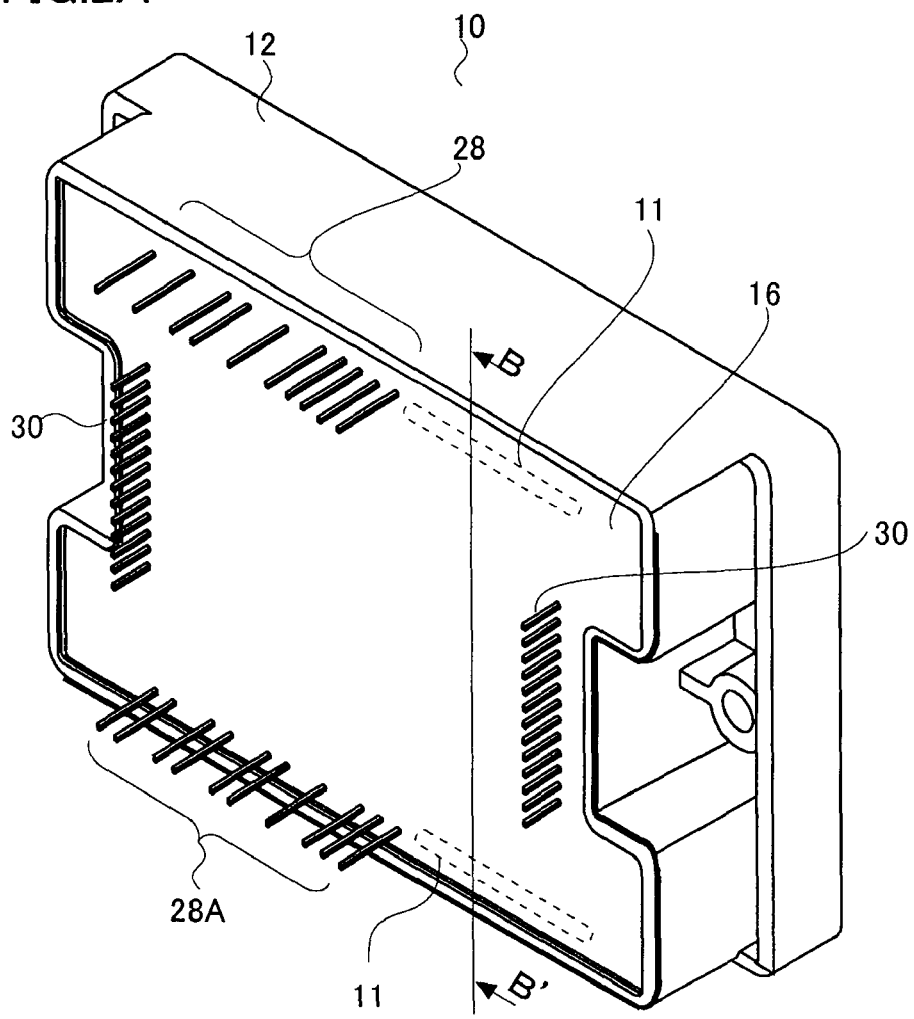
FIGS. 2A and 2B are views showing the hybrid integrated circuit device which is an embodiment of the circuit device of the present invention.

The external view of the hybrid integrated circuit device 10 is further described with reference to FIGS. 2A and 2B. FIG. 2A is a perspective view showing the external view of the hybrid integrated circuit device 10, and FIG. 2B is a cross sectional view of FIG. 2A taken along a B-B' line.

Figure 2B:
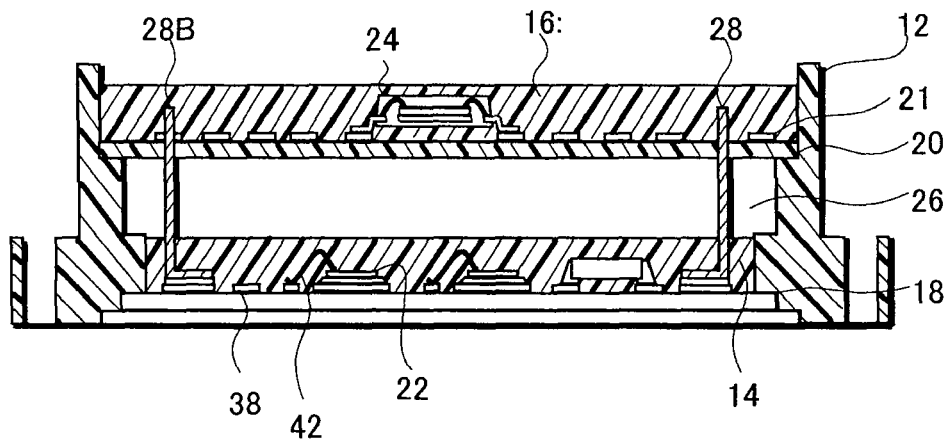

As shown in FIG. 2A and FIG. 2B, the opening on the front side of the case member 12 is entirely covered with the second sealing resin 16, and the lead 28A and the lead 30 are guided to the outside from the surface of the second sealing resin 16. The details of the lead 28A and the lead 30 are as described above. The lead 28A and the lead 30 serve as a connecting means for connecting a circuit provided inside the hybrid integrated circuit device 10 to the outside.

As shown in FIG. 2A, a region 11 is a region where the lead 28B is arranged. Specifically, while the lead 28B shown in FIG. 2B is provided in the region 11, the upper end of the lead 28B is terminated inside the second sealing resin 16 and is not guided to the outside. As described above, the lead 28B is a lead for connecting the first circuit element 22 mounted on the first circuit board 18 to the second circuit element 24 mounted on the second circuit board 20. Accordingly, the short circuit of the lead 28B can be prevented by not guiding the lead 28B to the outside.

Figure 3:
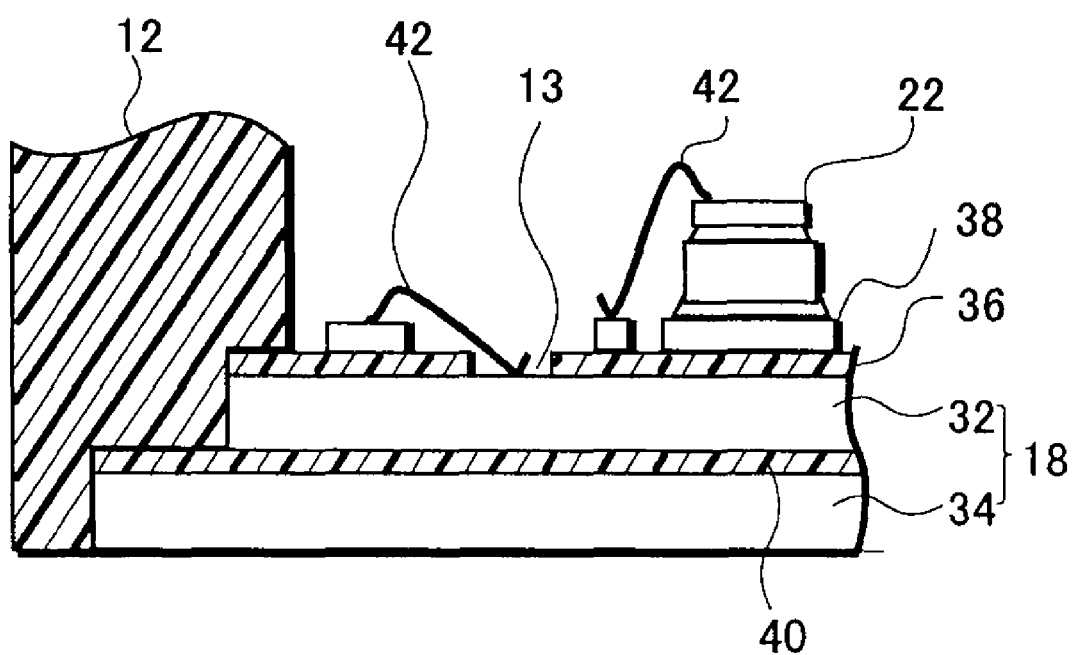
FIG. 3 is a cross sectional view showing a part of the hybrid integrated circuit device which is an embodiment of the circuit device of the present invention.

The configuration of the first circuit board 18 is described with reference to FIG. 3. In this embodiment, the first circuit board 18 is formed by stacking the mounting substrate 32 and the insulating substrate 34.

The mounting substrate 32 is a metal substrate containing aluminum (Al) as the primary material, with the thickness of around 1.0 mm to 2.0 mm and the upper face and the lower face thereof are covered with anodic oxide film (a film made of $Al_2O_3$). The upper face of the mounting substrate 32 is covered with an insulating layer 36 made of a resin material, such as an epoxy resin in which a filler is highly filled. The thickness of the insulating layer 36 is around 50 μm for example. In addition, the first conductive pattern 38 with the thickness of around 50 μm made of copper is formed on the upper face of the insulating layer 36, and the first circuit element 22 is mounted on the first conductive pattern 38.

Additionally, an exposed portion 13 is provided by partially removing the insulating layer 36, and the mounting substrate 32 appeared from the exposed portion 13 and the first conductive pattern 38 are connected to each other via the metal thin wire 42. Connecting the mounting substrate 32 and the first conductive pattern 38 to each other via the exposed portion 13 in this way allows the potential of the mounting substrate 32 to be set at a fixed potential (earth potential or power supply potential). Accordingly, the mounting substrate 32 contributes to the increase of the shielding effect for shielding noise from the outside. In addition, since the potentials of a part of the first conductive pattern 38 and the mounting substrate 32 become the same, a parasitic capacitance occurring between the both can be reduced.

The rear surface of the mounting substrate 32 having the above-described structure is bonded to the upper face of the insulating substrate 34 via an adhesive made of a silicon resin.

The insulating substrate 34 is made of a metal, such as aluminum, as is the case with the mounting substrate 32, and the plane size thereof is formed larger than that of the mounting substrate 32. Accordingly, the end portion of the insulating substrate 34 is spaced apart from the end portion of the mounting substrate 32. Additionally, the upper face of the insulating substrate 34 is covered with an insulating layer 40 made of a resin material, such as a polyimide resin. In addition, the lower face of the insulating substrate 34 is arranged on the same plane as the lower end of the side wall of the case member 12.

As described above, both of the heat release property and the withstand voltage of the first circuit board 18 can be kept at a high level with the configuration of the first circuit board 18 by stacking the mounting substrate 32 on the insulating substrate 34. Specifically, as described above, since the mounting substrate 32 is connected to the earth potential for example, by being connected to the first conductive pattern 38, an exposure of the rear surface of the mounting substrate 32 to the outside might cause a short circuit. The insulating substrate 34 is provided in order to prevent this short circuit. The upper face of the insulating substrate 34 and the lower face of the mounting substrate 32 are insulated from each other by the insulating layer 40 provided on the upper face of the insulating substrate 34. In addition, the side face of the mounting substrate 32 and the side face of the insulating substrate 34 are prevented from being short-circuited to each other by keeping a distance between the end portion (side face) of the insulating substrate 34 and the end portion (side face) of the mounting substrate 32, although the side faces of the both substrates are the faces where a metallic material, such as aluminum, constituting the respective substrates appears.

In addition, since both of the mounting substrate 32 and the insulating substrate 34 are made of a metal, such as aluminum being excellent in heat release property, a heat generated in the first circuit element 22 is excellently released to the outside via the mounting substrate 32 and the insulating substrate 34.

Figure 4:
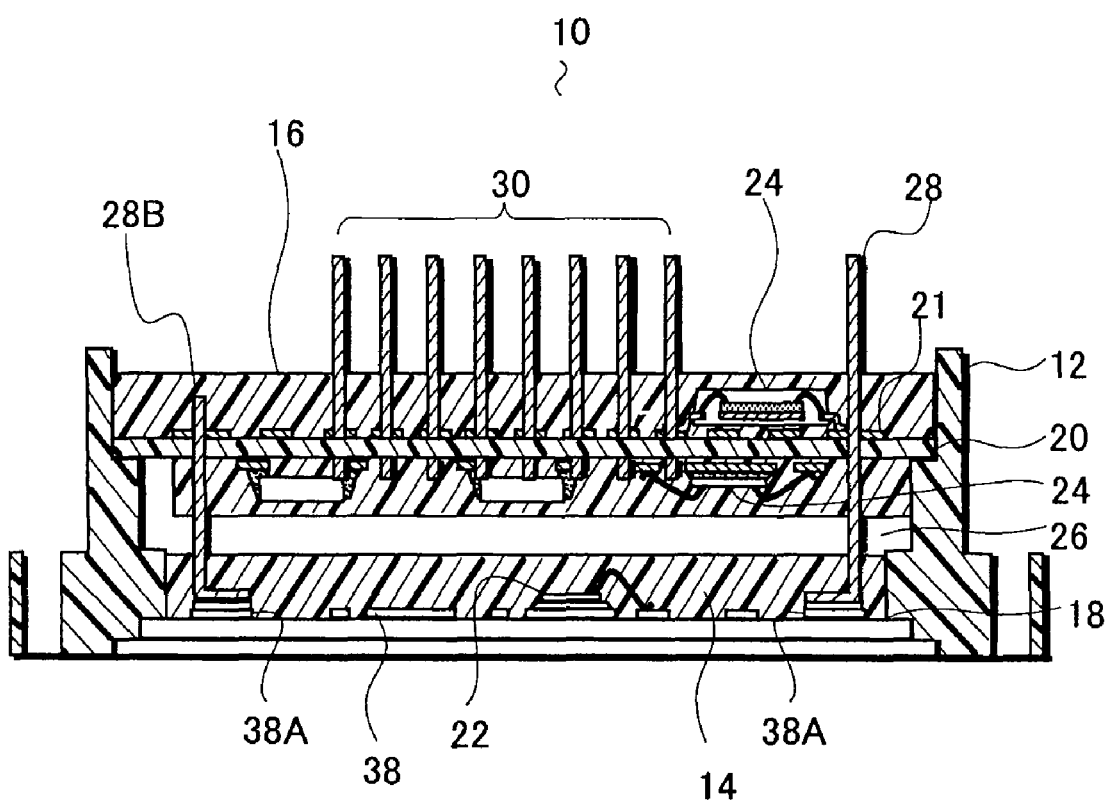
FIG. 4 is a cross sectional view showing a hybrid integrated circuit device which is an embodiment of the circuit device of the present invention.

Another form of the hybrid integrated circuit device 10 is described with reference to FIG. 4. Here, the second circuit elements 24 are mounted respectively on both of the upper face and the lower face of the second circuit board 20. Then, the second sealing resin 16 is formed so as to cover both of the upper faces and the lower faces of the second circuit elements 24 and the second circuit board 20.

By providing the second circuit element 24 also on the lower face of the second circuit board 20 in this way, a greater number of circuit elements can be incorporated in the hybrid integrated circuit device 10. In addition, the second circuit element 24 provided on the rear surface of the second circuit board 20 is sealed with the second sealing resin 16, thereby improving the moisture resistance and the vibration resistance of these elements.

Figure 5:
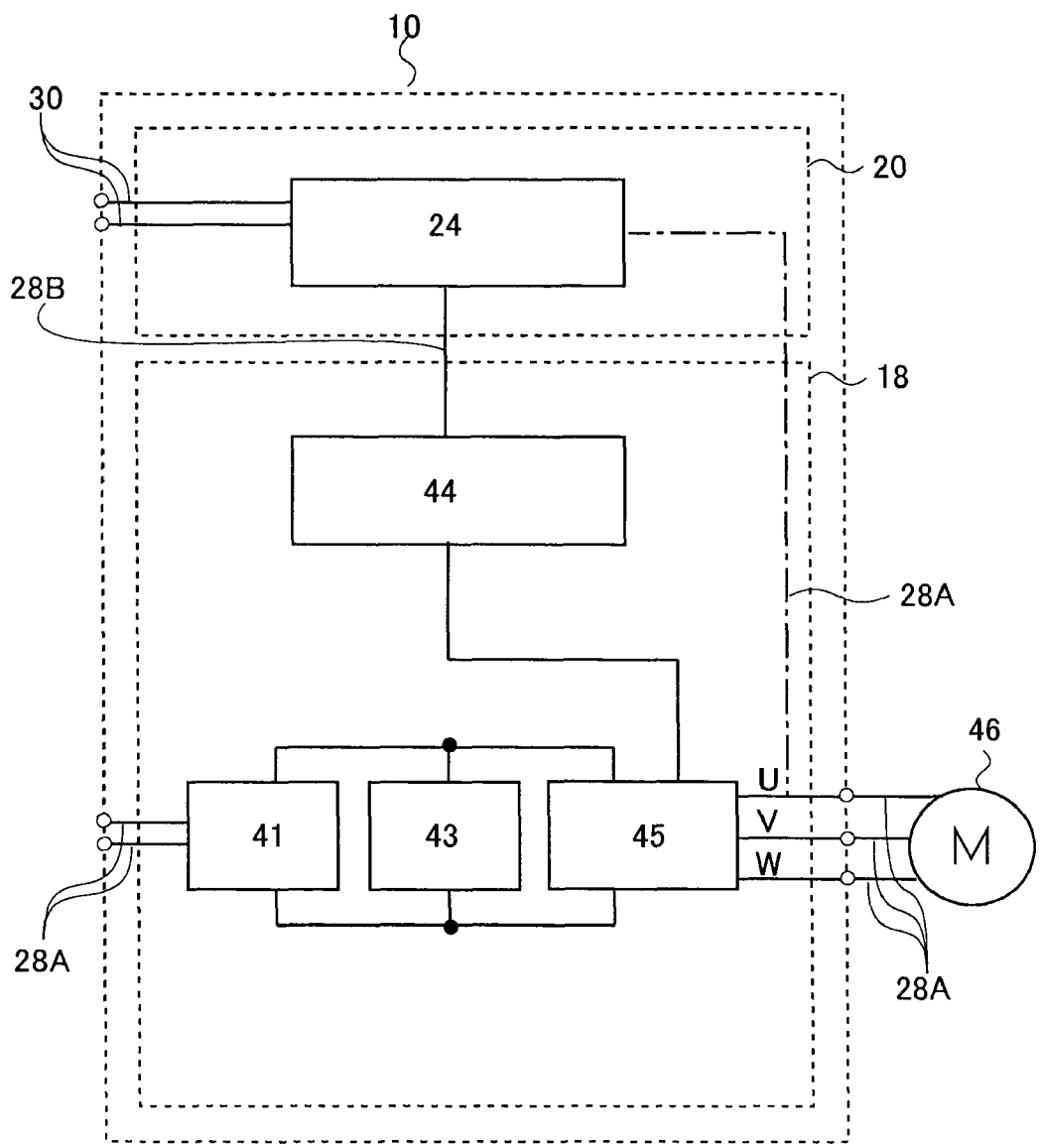
FIG. 5 is a block diagram showing a circuit incorporated in the hybrid integrated circuit device which is an embodiment of the circuit device of the present invention.

Next, an example of the circuit built in the hybrid integrated circuit device 10 is described with reference to FIG. 5. Here, an inverter circuit including a switching circuit 45 formed of a plurality of power transistors is formed on the first circuit board 18, while the second circuit element 24 (microcomputer) in which a control circuit for controlling this inverter circuit is configured is mounted on the second circuit board 20. More specifically, a rectifier circuit 41, a smoothing circuit 43, a switching circuit 45, and a driver IC 44 are incorporated in the first circuit board 18.

The operation of each of the circuits incorporated in the hybrid integrated circuit device 10 is described below. Firstly, a reference signal having a frequency corresponding to a rotational speed is inputted to the second circuit element 24 (microcomputer), which is mounted on the second circuit board 20, so that three sinewave control signals each having a pulse width being modulated, and a phase difference by 120 degrees, are generated. The control signal generated in the second circuit element 24 is inputted to the first circuit board 18 via the lead 28B (see FIG. 1A).

The control signal inputted to the first circuit board 18 is boosted to a predetermined voltage by a driver IC 44 and then is applied to a control electrode of a power transistor (IGBT, for example) constituting the switching circuit 45.

On the other hand, an alternating current power inputted from the outside is converted into a direct current power by the rectifier circuit 41, and then the voltage thereof is kept constant by the smoothing circuit 43, and this voltage is inputted to the switching circuit 45.

Then, the switching circuit 45 generates three-phase pulse-width-modulated sinewave voltages (U, V, W), each having a phase difference by 120 degrees, and the voltages thus generated are supplied to a motor 46. As a result, a load current that approximates the sinewave flows into the motor 46, so that the motor 46 rotates at a predetermined number of rotations.

Here, the signal passing through the lead 28A shown in FIG. 1B corresponds to a sinewave voltage (output signal) generated by the switching circuit 45, for example. Additionally, this output signal may be inputted to the second circuit element 24 (microcomputer) mounted on the second circuit board 20. This makes it possible to detect the position of a rotor (rotator) incorporated in the motor 46. In this case, as shown in FIG. 1A, the lead 28A is connected to the second circuit element 24 mounted on the second circuit board 20. In addition, an alternating current power which is inputted to the rectifier circuit 41 from the outside also corresponds to the signal passing through the lead 28A.

In addition, the signal passing through the lead 28B shown in FIG. 1C corresponds to a control signal which is inputted to the first circuit element (here, driver IC 44) from the second circuit element 24 (microcomputer). Additionally, the electric signal passing through the lead 30 corresponds to a reference signal which is inputted to the second circuit element 24 from the outside.

Figure 6A:
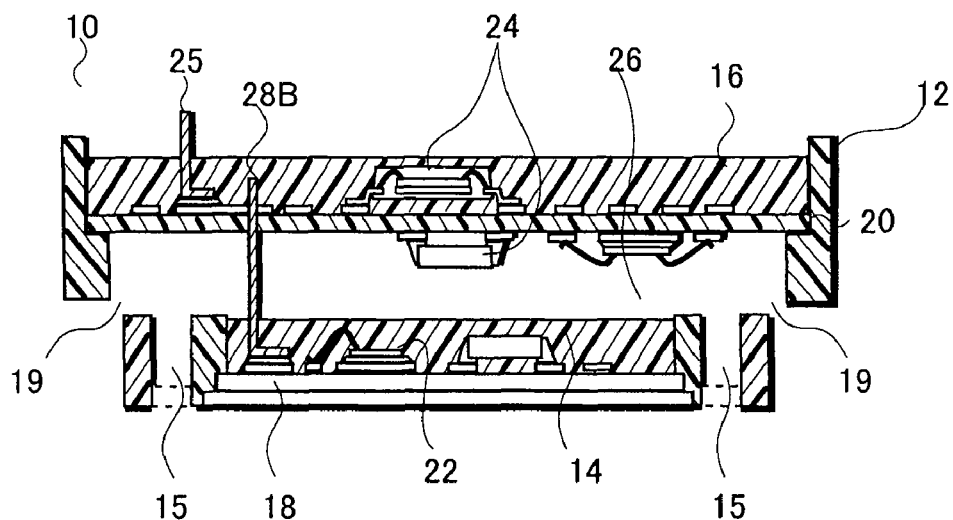
FIGS. 6A and 6B are views showing a hybrid integrated circuit device which is an embodiment of the circuit device of the present invention.
Figure 6B:
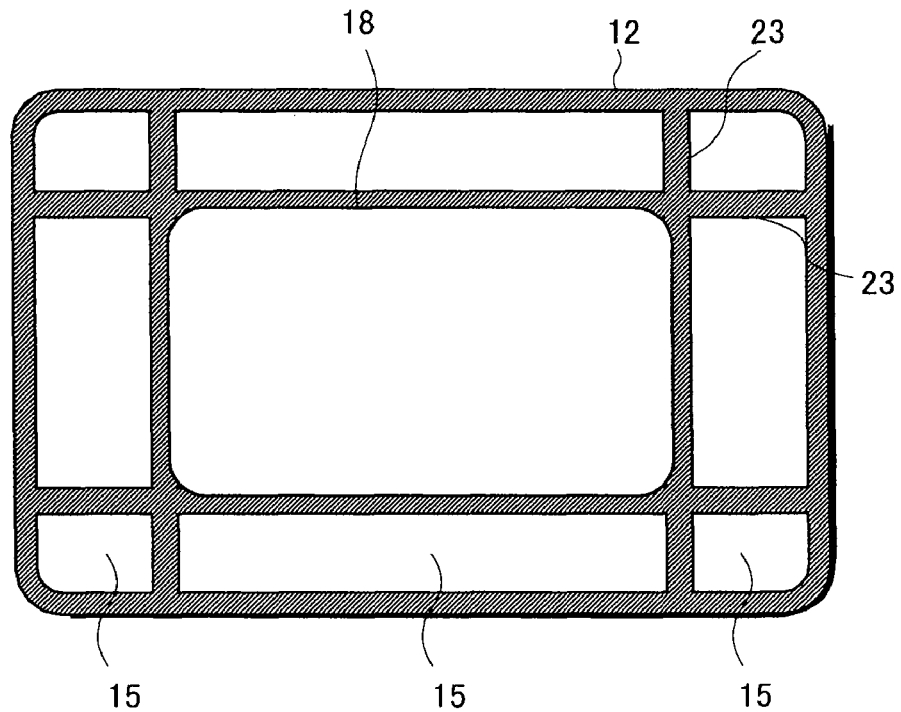

Another configuration of the hybrid integrated circuit device 10 is described with reference to FIGS. 6A and 6B. Although the configuration of the hybrid integrated circuit device 10 shown in FIGS. 6A and 6B is basically the same as the one described above, the configuration of communicating holes 15, 19 provided in the case member 12 differs. FIG. 6A is a cross sectional view of the hybrid integrated circuit device 10, and FIG. 6B is a plan view of the hybrid integrated circuit device 10 when viewed from below.

As shown in FIG. 6A, the first circuit board 18, on which a power transistor is arranged, is formed smaller than the second circuit board 20, on which controlling elements, such as a microcomputer, are arranged. The case member 12 has a size large enough to house a relatively large second circuit board 20, and therefore, a free space is produced in the periphery of the first circuit board 18 if the first circuit board 18 is arranged in the center portion of the case member 12. Here, the communicating opening 15 is provided in the bottom of the case member 12 in the periphery of the first circuit board 18. With this configuration, the air with high temperature in the hollow portion 26 inside the device is released to the outside through the communicating opening 15. At the same time, the unheated air is admitted into the hollow portion 26 through the communicating opening 15. In addition, a communicating opening 19 is provided by partially opening a side wall part of the case member 12, and the communicating opening 19 has the same function as that of the communicating opening 15.

As shown in FIG. 6B, a supporting part 23 in a frame form is provided in the case member 12, whereby the first circuit board 18 is supported by the supporting part 23 near the center portion of the case member 12. In the rear surface of the case member 12, the communicating opening 15 is provided in the periphery of the first circuit board 18.

In addition, as shown in FIG. 6A, an output signal from the switching circuit formed on the upper face of the first circuit element 22 may be outputted to the outside via both of the lead fixedly secured to the upper face of the first circuit board 18 and the lead fixedly secured to the second circuit board. In addition, a high current of the source power or the like may be inputted to the inside of the device via the both of the leads. Specifically, the lead 28B is fixedly secured to the upper face of the first circuit board 18, and the lead 28B is connected to the first circuit element 22 constituting the switching circuit. Then, the upper end of the lead 28B penetrates the second circuit board 20 and is connected to a conductive pattern formed on the upper face of the second circuit board 20. Additionally, the upper end part of the lead 28B is not guided to the outside.

A lead 25 which is formed thicker than the lead 28B is fixedly secured to the upper face of the second circuit board 20, and the lead 25 is connected to the lead 28B via the conductive pattern formed on the upper face of the second circuit board 20. This configuration allows an output from the first circuit element 22 to be taken out to the outside via the lead 28B and the lead 25, the first circuit element 22 being arranged on the upper face of the first circuit board 18.

Additionally, a small signal, such as a control signal or an input to a sensor, may be inputted and outputted through a plug-in type connector mounted on the upper face of the second circuit board 20.

Figure 7A:
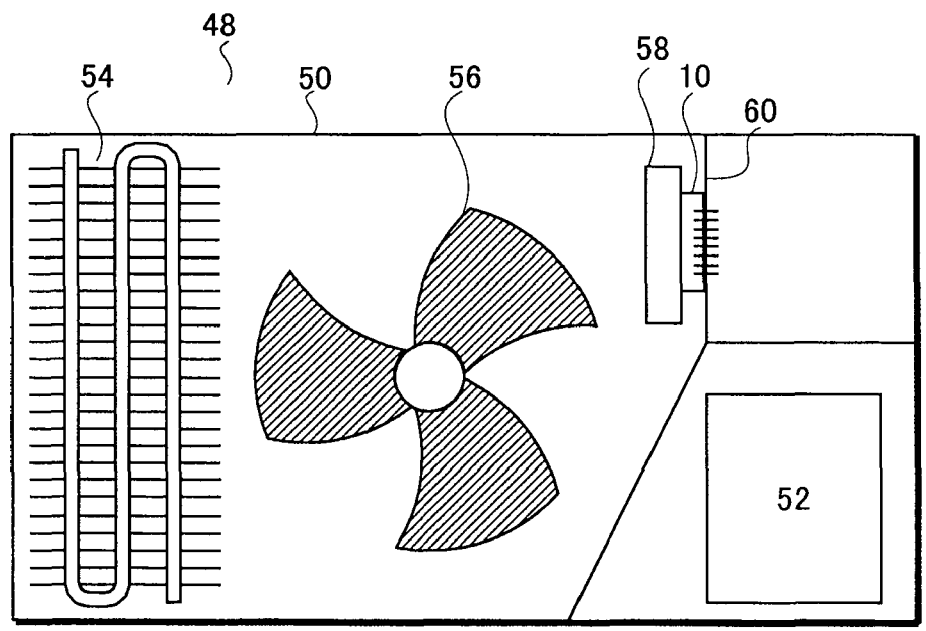
FIG. 7A is a view showing an outdoor unit, into which the hybrid integrated circuit device which is an embodiment of the circuit device of the present invention is incorporated.

Next, the configuration of an outdoor unit 48 of an air conditioner, in which the hybrid integrated circuit device 10 having the above-described configuration is incorporated, is described with reference to FIG. 7.

The outdoor unit 48 is mainly formed of a condenser 54, a fan 56, a compressor 52, and the hybrid integrated circuit device 10 which are incorporated inside a housing 50.

The compressor 52 has a function to compress a refrigerant, such as ammonia, using the driving force of the motor. Then, the refrigerant compressed by the compressor 52 is delivered to the condenser 54, and then a heat contained in the refrigerant inside the condenser 54 is released to the outside by the fan 56 blowing wind to the condenser 54. In addition, after being expanded, this refrigerant is delivered to an evaporator in the room to cool the air in the room.

This form of hybrid integrated circuit device 10 has a function to control the rotation of the motor for driving the compressor 52 or the fan 56, and is fixedly secured to a mounting substrate 60 provided inside the outdoor unit 48.

Figure 7B:
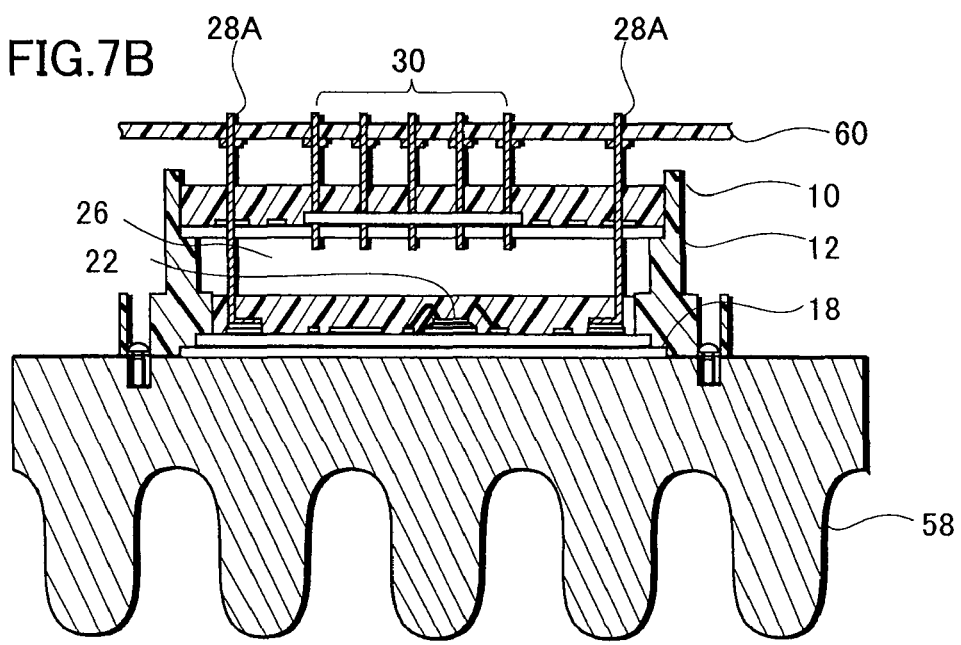
FIG. 7B is a cross sectional view of a portion to which the hybrid integrated circuit device is attached.

FIG. 7B shows a structure in which the hybrid integrated circuit device 10 is mounted. Here, the lead 28A and the second lead 30 are inserted into the mounting substrate 60 to be mounted thereon. The rear surface of the first circuit board 18 on which the power transistors are mounted is in contact with a smooth surface of a heat sink 58. The hybrid integrated circuit device 10 can be attached to the heat sink 58 by screwing the case member 12 of the hybrid integrated circuit device 10 into the heat sink 58. Here, the heat sink 58 is formed by integrally molding a metal, such as copper or aluminum. The surface of the heat sink being in contact with the hybrid integrated circuit device 10 is smooth, and the surface opposite thereto is irregular. With such a configuration, a heat generated in the first circuit element 22, which is the power transistor, is conducted to the internal space of the outdoor unit 48 via the first circuit board 18 and the heat sink 58, and is finally released to the outside of the outdoor unit 48 by the blowing operation of the fan 56.

Next, a method of manufacturing the hybrid integrated circuit device 10 whose configuration is shown in FIG. 1 is described with reference to FIGS. 8A, 8B, 9A, 9B and 10.

Figure 8A:
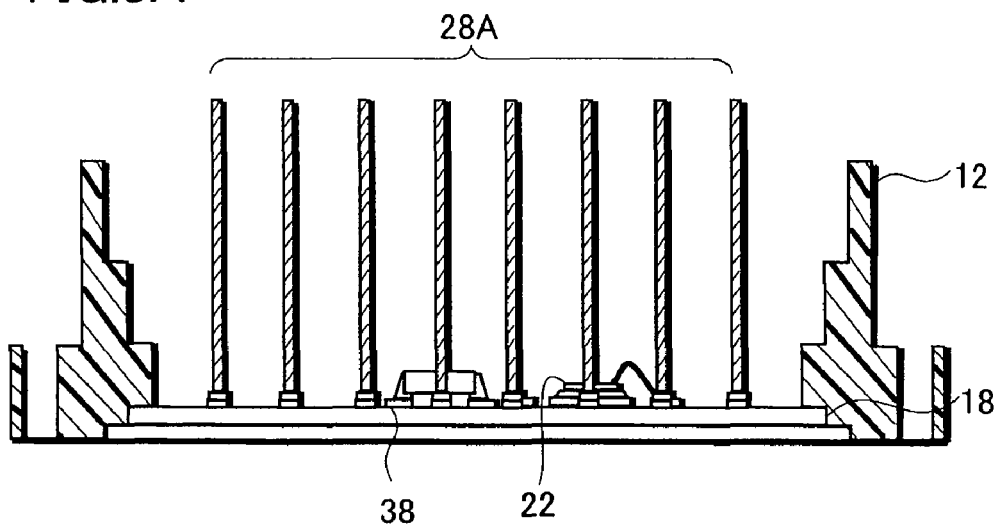
FIGS. 8A and 8B are views showing a method of manufacturing the hybrid integrated circuit device which is an embodiment of the circuit device of the present invention.

As shown in FIG. 8A, firstly, the first circuit board 18 in which a predetermined hybrid integrated circuit is incorporated in the upper face thereof is incorporated into the case member 12.

A first conductive pattern 38 having a predetermined shape is incorporated in advance in the upper face of the first circuit board 18, and the first circuit element 22 such as a power transistor is mounted on and electrically connected to a predetermined portion in the first conductive pattern 38. In addition, the lead 28A is fixedly secured to the pad-like first conductive pattern 38 with a conductive adhesive, such as solder. Here, the lead 28A may be fixedly secured to the first conductive pattern 38, in the form of a lead frame in which multiple leads 28A are connected together.

The first circuit board 18 having such a configuration is incorporated into the case member 12 so as to cover the lower opening of the case member 12. The details of the first circuit board 18 are as described above, and the first circuit board 18 is formed by combining a substrate formed of two metal substrates, as shown in FIG. 3. However, the first circuit board 18 may be formed from one metal substrate.

Figure 8B:
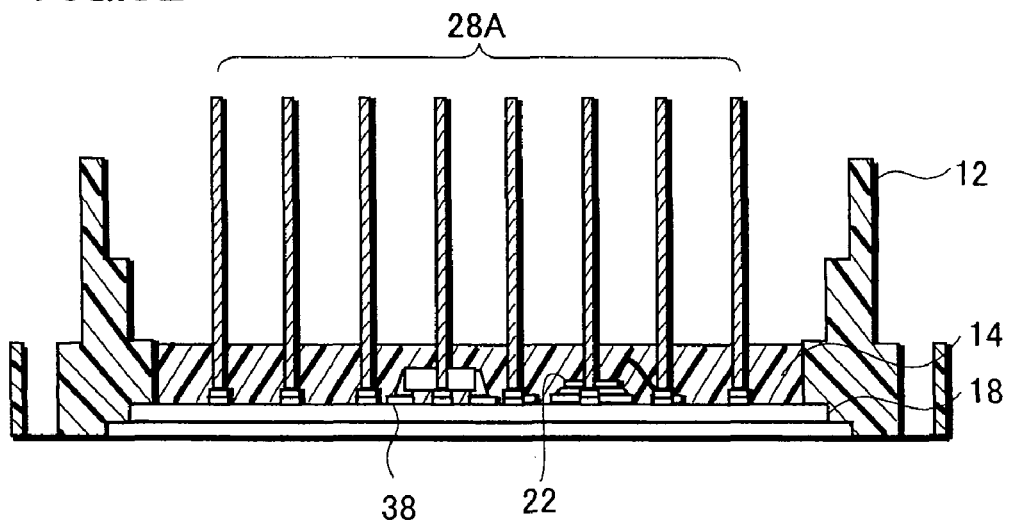

As shown in FIG. 8B, next, the first sealing resin 14 is formed so as to cover the upper face of the first circuit element 22 and the first circuit board 18. Specifically, the liquid or semi-solid first sealing resin 14 is supplied into the case member 12 so as to seal the first circuit element 22 and so as to cover the upper face of the first circuit board 18. The first sealing resin 14 is made of a resin material in which a filler is mixed. If the resin material constituting the first sealing resin 14 is a thermosetting resin, a process of heating and curing the first sealing resin 14 is required, the first sealing resin 14 being applied to the upper face of the first circuit board 18.

Figure 9A:
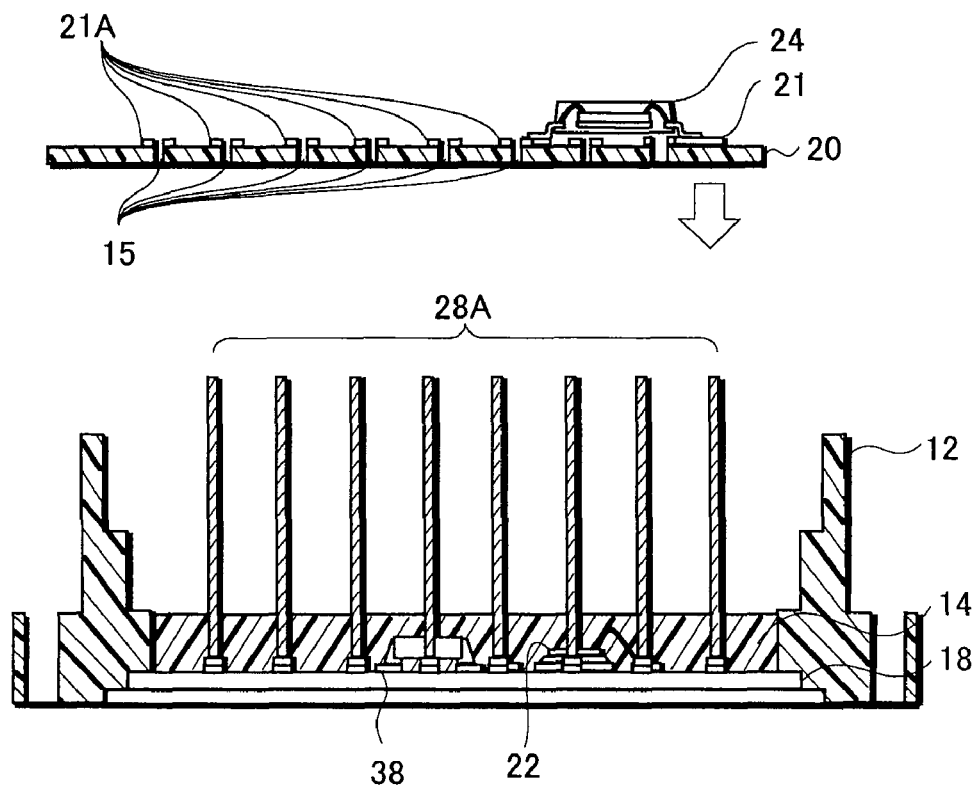
FIGS. 9A and 9B are views showing the method of manufacturing the hybrid integrated circuit device which is an embodiment of the circuit device of the present invention.
Figure 9B:
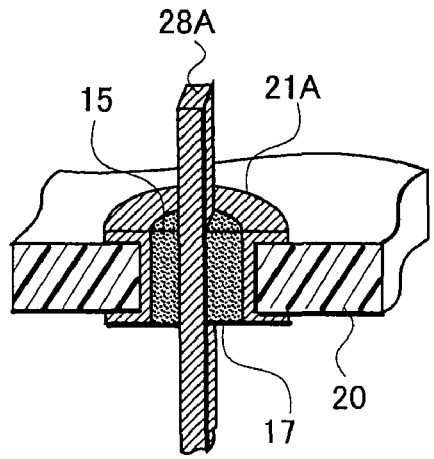

Subsequently, as shown in FIG. 9A and FIG. 9B, the second circuit board 20 in which the predetermined second circuit element 24 is incorporated is incorporated into the case member 12.

As shown in FIG. 9A, the second conductive pattern 21 having a predetermined shape is formed on the upper face of the second circuit board 20, and the second circuit element 24 which is, for example, a microcomputer is fixedly secured to a predetermined portion in the second conductive pattern 21.

In addition, in a portion corresponding to the lead 28A of the second circuit board 20, the through-hole 15 is provided by opening the second circuit board 20 by drilling or laser irradiation processing. Additionally, the pad 21A formed of a part of the second conductive pattern 21 is formed in the periphery of the through-hole 15.

The second circuit board 20 having such a configuration is incorporated into the case member 12 so as to cover the upper opening of the case member 12. The periphery of the lower face of the second circuit board 20 is bonded to the case member 12 with an insulative adhesive. In addition, in this step, at the time of incorporation of the second circuit board 20 into the case member 12, the lead 28A passes through the through-hole 15 provided in the second circuit board 20.

As shown in FIG. 9B, in this step, the bonding agent 17 is filled in the gap between the side wall of the through-hole 15 and the lead 28A. As the bonding agent 17, employed is a conductive adhesive, such as a conductive paste or solder. A specific method of forming the bonding agent 17 is described. The bonding agent 17 is applied to each of the through-holes 15 of the second circuit board 20 in advance, and subsequently, the lead 28A passes through each of the through-holes 15. Alternatively, the bonding agent 17 may be filled in the gap between each of the through-holes 15 and the lead 28A after the lead 28A passes through the through-hole 15. Here, if the bonding agent 17 is made of solder, then solder cream is applied to the through-hole 15 and thereafter a step of heat-melting the solder cream is required to obtain solder.

Note that, in this step, the bonding agent 17 is supplied also to the lead 28B shown in FIG. 1 in a similar manner.

Figure 10:
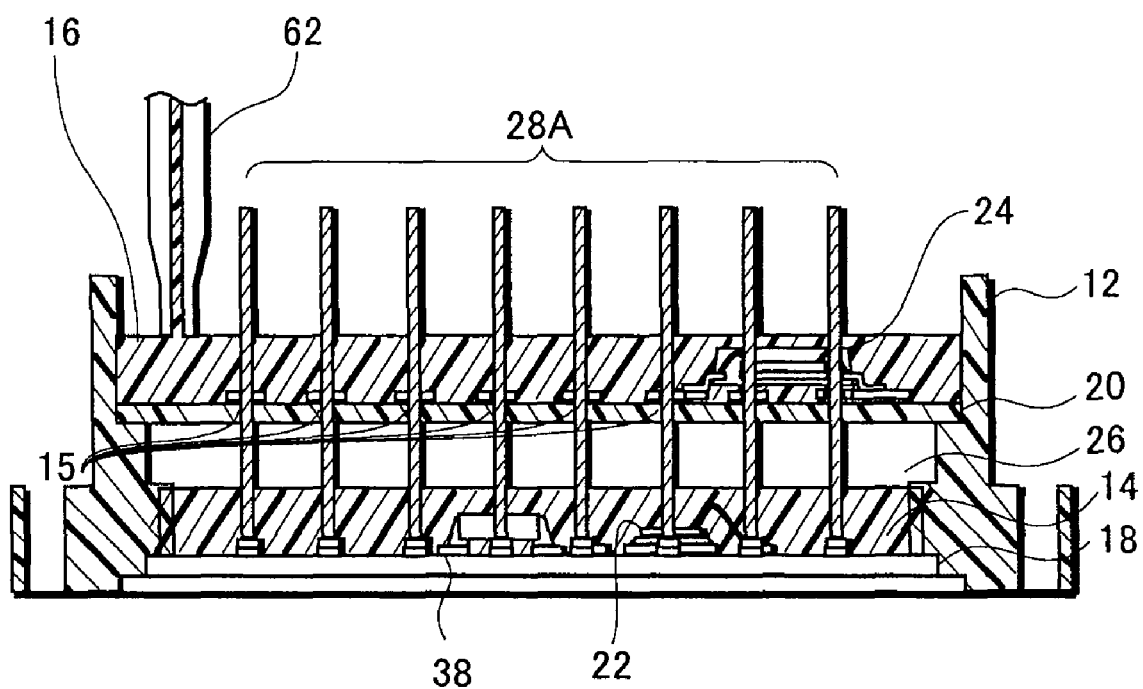
FIG. 10 is a cross sectional view showing the method of manufacturing the hybrid integrated circuit device which is an embodiment of the circuit device of the present invention.
Figure 11:
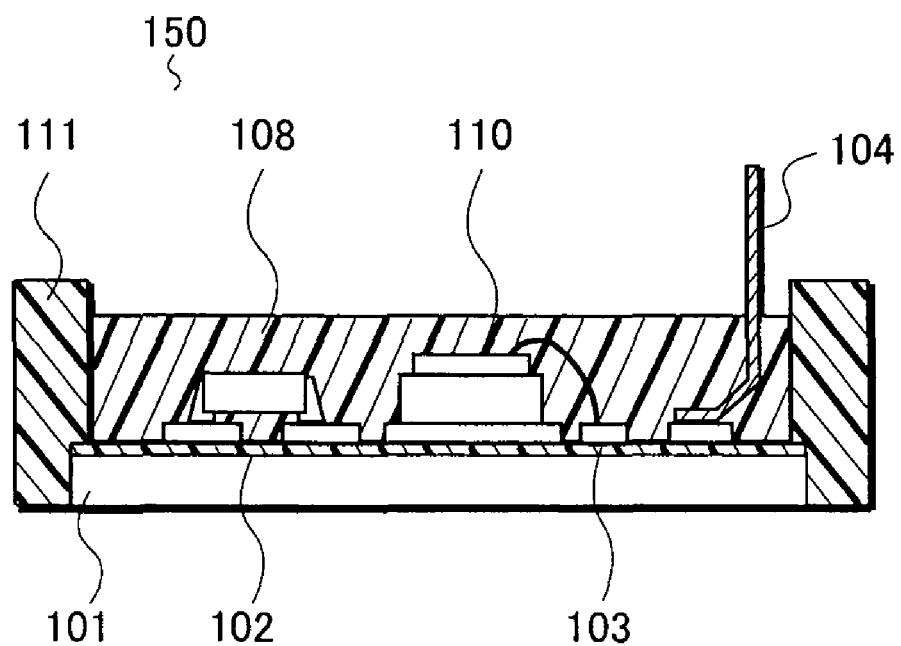
FIG. 11 is a cross sectional view showing a hybrid integrated circuit device described in the background of the invention.

Subsequently, as shown in FIG. 10, the second sealing resin 16 is formed so as to seal the second circuit element 24 and the upper face of the second circuit board 20. Here, a predetermined amount of second sealing resin 16 is supplied from the lower end of a nozzle 62 to the space surrounded by the upper face of the second circuit board 20 and the inner side of the side wall of the case member 12, and then a curing treatment such as heating is applied thereto as required. The second sealing resin 16 is made of a thermoplastic resin or a thermosetting resin in which a filler such as a granular alumina is mixed.

The second sealing resin 16 supplied from the nozzle 62 to the upper face of the second circuit board 20 is in a liquid or semi-solid state. Accordingly, if a gap is left between the lead 28A and the through-hole 15 which is provided penetrating the second circuit board 20, the second sealing resin 16 may enter into the hollow portion 26 through this gap. On the other hand, the hollow portion 26 serves as a layer for suppressing the conduction of the heat generated in the first circuit element 22 to the second circuit element 24. Accordingly, if the hollow portion 26 is filled with the second sealing resin 16, the heat generated in the first circuit element 22 is conducted through the filled second sealing resin 16 to the second circuit element 24, and the operation of the second circuit element 24 having a low operating temperature might become unstable.

However, in this embodiment, the bonding agent 17 is filled inside each of the through-holes 15 of the second circuit board 20, as shown in FIG. 9B. This configuration prevents the second sealing resin 16 from leaking into the hollow portion 26 through the through-hole 15.

With the above-described steps, the hybrid integrated circuit device 10 whose structure is shown in FIG. 1 is manufactured.

In the present invention, the first circuit element arranged on the first circuit board and the second circuit element arranged on the second circuit board can be efficiently connected to each other using a lead having various functions, the lead being fixedly secured to the circuit boards which are arranged being overlaid inside the circuit device. Specifically, the lead usually serves as a connection between an electric circuit formed on a substrate and the outside. However, in the present invention, in addition to the connection therebetween, the lead also serves as a connection between the first circuit element arranged on the first circuit board and the second circuit element arranged on the second circuit board. Accordingly, the first circuit element arranged on the first circuit board and the second circuit element arranged on the second circuit board can be connected to each other in any place via the lead. Accordingly, a complicated control circuit can be incorporated into the circuit device.

In the present invention, the first circuit board and the second circuit board are provided inside the case member, and a lead having its one end being fixedly secured to the first circuit board, passes a through-hole provided in the second circuit board to be guided to the outside. In addition, the lead includes the first lead connected to the second circuit element which is fixedly secured to the second circuit board, and the second lead which is not connected thereto. In the present invention, a bonding agent is filled in a gap between the first lead and the through-hole, and the bonding agent is also filled in a gap between the second lead and the through-hole. This operation can prevent a liquid sealing resin from leaking through the through-hole, even if a semi-solid or liquid sealing resin is applied to the upper face of the second circuit board.

What is claimed is:

1. A circuit device, comprising:
   a case member;
   a first circuit board incorporated into the case member, the first circuit board having a first conductive pattern formed on a surface thereof;
   a second circuit board arranged over the first circuit board and incorporated into the case member, the second circuit board having a second conductive pattern formed on a surface thereof;
   a first circuit element mounted on the first circuit board and electrically connected to the first conductive pattern;
   a second circuit element mounted on the second circuit board and electrically connected to the second conductive pattern; and
   a lead structure secured to the first circuit board or the second circuit board,
   wherein the lead structure includes a first lead connected to the first circuit element, not connected to the second circuit element and penetrating through the second circuit board and a second lead connected to both the first circuit element mounted on the first circuit board and the second circuit element mounted on the second circuit board.

2. The circuit device according to claim 1, wherein the lead structure further includes a third lead connected to the second circuit element and not connected to the first circuit element.

3. The circuit device according to claim 2, further comprising a sealing resin which is disposed on an upper face of the second circuit board so as to cover the second circuit element, wherein end portions of the first lead and the third lead penetrate through the sealing resin so that the end portions protrude from the sealing resin, and an end portion of the second lead is positioned inside the sealing resin.

4. The circuit device according to claim 2, wherein the first circuit element mounted on the first circuit board includes a power transistor, the second circuit element mounted on the second circuit board includes a controlling element which generates a control signal for controlling the power transistor, and the control signal is supplied to the power transistor via the second lead.

5. The circuit device according to claim 1, wherein the first lead penetrates through an opening in the case member.

6. A circuit device, comprising:
   a case member;
   a first circuit board incorporated into the case member, the first circuit board having a first conductive pattern formed on a surface thereof;
   a second circuit board arranged over the first circuit board and incorporated into the case member, the second circuit board having a second conductive pattern formed on a surface thereof;
   a first circuit element mounted on the first circuit board and electrically connected to the first conductive pattern;
   a second circuit element mounted on the second circuit board and electrically connected to the second conductive pattern;
   a sealing resin which is disposed on the surface of the second circuit board so as to seal the second circuit element; and
   a lead structure including a first lead having one end connected to the first conductive pattern on the surface of the first circuit board and having another end passing through a first through-hole provided in the second circuit board so as to protrude from the sealing resin, the lead structure further including a second lead penetrating through a second through-hole provided in the second circuit board and electrically connected to the second circuit element mounted on an upper face of the second circuit board, and the first lead not being electrically connected to the second circuit element mounted on the second circuit board;
   a first bonding agent filling a gap between the first lead and the first through-hole of the second circuit board and
   a second bonding agent filling a gap between the second lead and the second through-hole.

7. The circuit device according to claim 6, wherein the first bonding agent and the second bonding agent are a solder.

8. The circuit device according to claim 6, further comprising a pad connected to the second conductive pattern provided in the periphery of the through-hole of the second circuit board.

* * * * *